United States Patent
Toyama

Patent Number: 5,578,948
Date of Patent: Nov. 26, 1996

[54] HARMONIC TONE GENERATOR FOR LOW LEVEL INPUT AUDIO SIGNALS AND SMALL AMPLITUDE INPUT AUDIO SIGNALS

[75] Inventor: Soichi Toyama, Tokyo, Japan

[73] Assignee: Pioneer Electronic Corporation, Tokyo, Japan

[21] Appl. No.: 819,987

[22] Filed: Jan. 13, 1992

[30] Foreign Application Priority Data

Jun. 28, 1991 [JP] Japan ................................ 3-158915

[51] Int. Cl.$^6$ ............................. H03B 19/00; G10H 7/00
[52] U.S. Cl. ............................. 327/119; 84/602; 84/616
[58] Field of Search ................... 328/16, 28; 307/261; 381/29, 36, 51; 84/603, 660, 602, 616; 327/119

[56] References Cited

U.S. PATENT DOCUMENTS 4,700,390  10/1987  Machida .................... 84/660
5,086,475  2/1992  Kutaragi et al. .................... 84/603

Primary Examiner—David C. Nelms
Assistant Examiner—Trong Phan
Attorney, Agent, or Firm—Fish & Richardson P.C.

[57] ABSTRACT

A harmonic tone generator produces a harmonics signal even for input audio signals of a small amplitude. Conversion of a digitized audio signal in accordance with a predetermined non-linear function is performed also for an audio signal of a small amplitude. According to the second aspect of the invention, a level difference between the digital audio signal level in the present sampling time and the audio signal level in the preceding sampling time is detected and the detected level difference is converted to an output value in accordance with a predetermined non-linear function by a non-linear converting circuit. The converted output value is accumulated. According to the third aspect of the invention, the detected level difference is converted to a function conversion output in accordance with a predetermined function by a non-linear converting circuit. A gain of an amplifier to amplify the audio signal in the present sampling time is changed in accordance with the function conversion output.

8 Claims, 10 Drawing Sheets

HARMONIC TONE GENERATOR FOR LOW LEVEL INPUT AUDIO SIGNALS AND SMALL AMPLITUDE INPUT AUDIO SIGNALS

BACKGROUND OF THE INVENTION

1. Field of the Invention

The invention relates to a harmonic tone generator which is used in an audio apparatus such as an apparatus for amplifying a vocal signal from a microphone with reproduced orchestral accompaniment sound signals.

2. Description of Background Information

A construction of a conventional harmonic tone generator is shown in FIG. 1. In such a generator, an input audio signal is supplied to an HPF (high pass filter) 1. The audio signal which has passed through the HPF 1 is supplied to an amplitude limiter 2 and a signal having only components of a predetermined level or higher is derived. An output signal of the amplitude limiter 2 is supplied to a harmonics generator 3. The harmonics generator 3 comprises a clipping circuit using a nonlinear characteristic portion of a diode. The diode has input/output characteristics as shown in, e.g., FIG. 2. As compared with an input audio signal $A_{in}$, an output signal $A_{out}$ has a waveform clipped by the non-linear characteristic portion of the diode and includes a harmonics signal. The harmonics signal which is generated from the harmonics generator 3 is attenuated by an attenuator 4 and supplied to an adder 5. The adder 5 adds the attenuated harmonics signal and the input audio signal of the original signal together, generating an addition signal. Such a harmonic tone generator with the above construction is disclosed in, for instance, Japanese Utility Model application No. 62-146313.

In the conventional harmonic tone generator, however, there is a problem such that a harmonics signal is not produced, not only in the case where the level of the input audio signal is lower than a predetermined level but also in the case where the input audio signal is of a small amplitude which doesn't reach the non-linear characteristic portion of the diode even when the level of the input audio signal is equal to or higher than the predetermined level, for example, as the relationship between an input signal $B_{in}$ and an output signal $B_{out}$ in FIG. 2.

OBJECT AND SUMMARY OF THE INVENTION

It is an object of the invention to provide a harmonic tone generator which can produce a harmonics signal even for audio signals having a small amplitude.

A harmonic tone generator according to the first aspect of the invention comprises: A/D converting means for converting an analog audio signal into a digital audio signal indicative of audio signal level; non-linear converting means for converting the digital audio signal generated by the A/D converting means into an output digital signal in accordance with a predetermined nonlinear function; and D/A converting means for converting the output digital signal of the non-linear converting means into an analog signal.

A harmonic tone generator according to the second feature of the invention comprises A/D converting means for converting an analog audio signal into a digital signal indicative of audio signal level; difference detecting means for detecting a level difference between the audio signal level at the present sampling time point which is generated from the A/D converting means and the audio signal level at a preceding sampling time point; non-linear converting means for converting the detection level difference generated by the difference detecting means into an output value in accordance with a predetermined non-linear function; accumulating means for accumulating output values of the non-linear converting means; and D/A converting means for converting an output digital signal indicative of the result of the accumulation by the accumulating means into an analog signal.

A harmonic tone generator according to the third feature of the invention comprises: A/D converting means for converting an analog audio signal into a digital signal indicative of audio signal level; difference detecting means for detecting a level difference between the audio signal level at the present time point which is generated from the A/D converting means and the audio signal level at a preceding time point; converting means for converting the detection level difference by the difference detecting means into a conversion output in accordance with a predetermined function; amplifying means for amplifying the audio signal at the present sampling time point which is generated from the A/D converting means by a gain corresponding to the conversion output of the converting means; and D/A converting means for converting an output digital signal of the amplifying means into an analog signal.

In the harmonic tone generator according to the first aspect of the invention, the digital audio signal is converted in accordance with the predetermined nonlinear function and even an audio signal of a small amplitude is converted in accordance with the predetermined non-linear function.

In the harmonic tone generator according to the second aspect of the invention, the difference between the digital audio signal level at the present time point and the audio signal level at the preceding time point is detected. The detected level difference is converted by the non-linear converting means in accordance with a predetermined non-linear function and the converted output values are accumulated.

In the harmonic tone generator according to the third aspect of the invention, the level difference between the digital audio signal level at the present time point and the audio signal level at the preceding time point is detected. The detected level difference is converted by the non-linear converting means in accordance with a predetermined function. A gain of the amplifying means for amplifying the audio signal at the present time point is changed in accordance with the function converted output.

DETAILED DESCRIPTION OF THE PREFERRED EMBODIMENTS

The preferred embodiments of the invention will be described in detail hereinafter with reference to the accompanying drawings.

Figure 1:
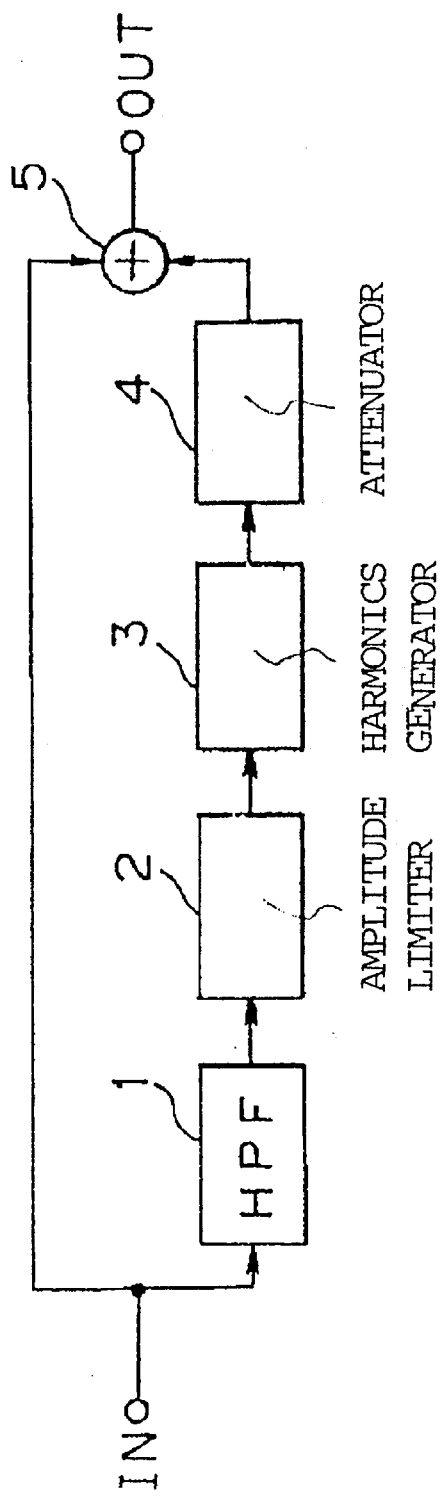
FIG. 1 is a block diagram showing a construction of a conventional harmonic tone generator.
Figure 2:
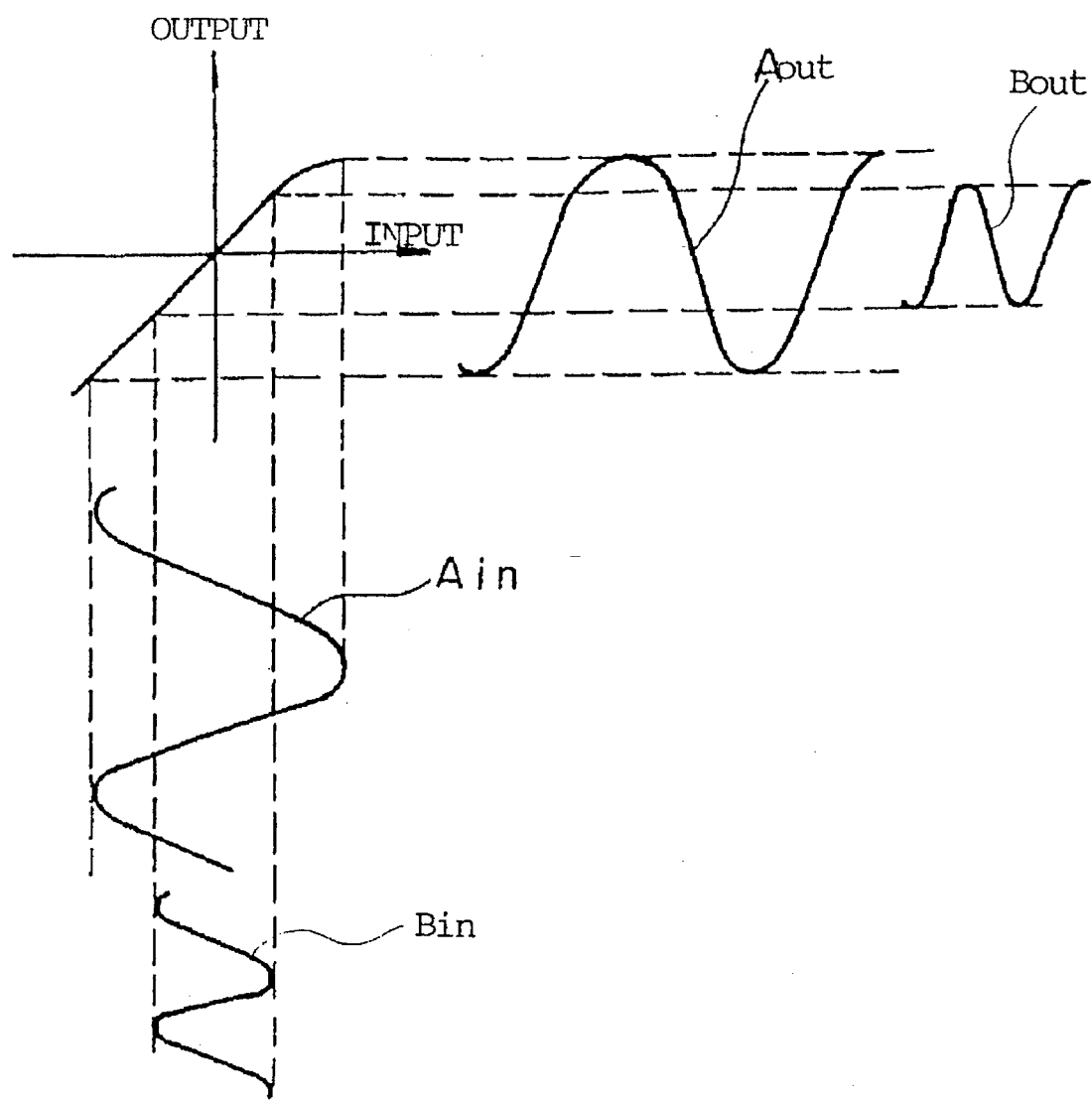
FIG. 2 is a diagram showing input/output characteristics of a harmonics generator in the harmonic tone generator in FIG. 1.
Figure 3:
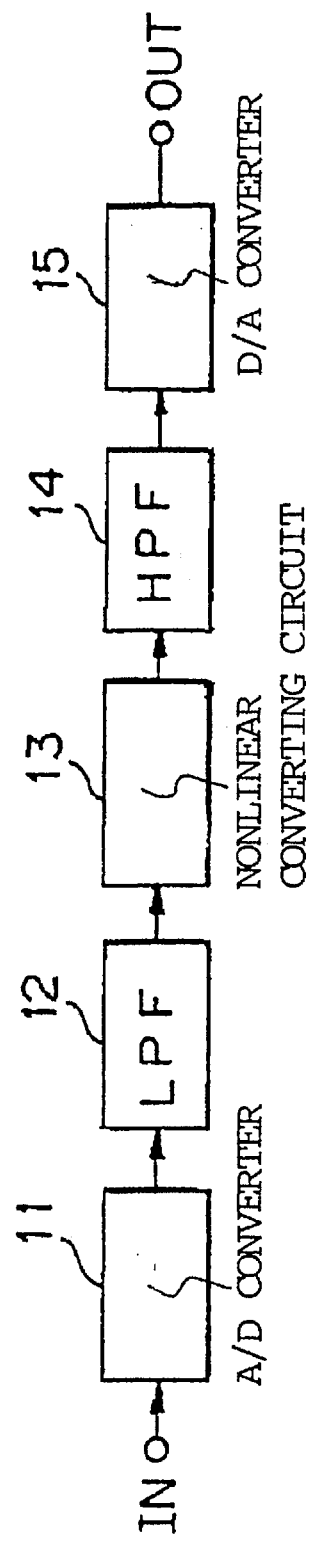
FIG. 3 is a block diagram showing an embodiment according to the first aspect of the invention.

In a harmonic tone generator according to the invention shown in FIG. 3, an LPF (low pass filter) 12 is connected through an A/D converter 11 to an input terminal IN to which an analog audio signal is supplied. The A/D converter 11 samples the analog audio signal at predetermined timings and converts the sampled values into digital signals. The LPF 12 is a digital filter for allowing signal components of the digital audio signal generated by the A/D converter 11 which are equal to or lower than a predetermined frequency, to pass therethrough. A non-linear converting circuit 13 is connected to an output of the LPF 12. The non-linear converting circuit 13 has a function such that it is non-linear between an input signal and an output signal and generates a harmonics signal by using the non-linear function. An HPF (high pass filter) 14 is connected to an output of the non-linear converting circuit 13. The HPF 14 is a digital filter and allows only the harmonics signal components in the signal generated from the non-linear converting circuit 13 to pass therethrough. An output signal of the HPF 14 is connected to an output terminal OUT through a D/A converter 15.

Figure 4:
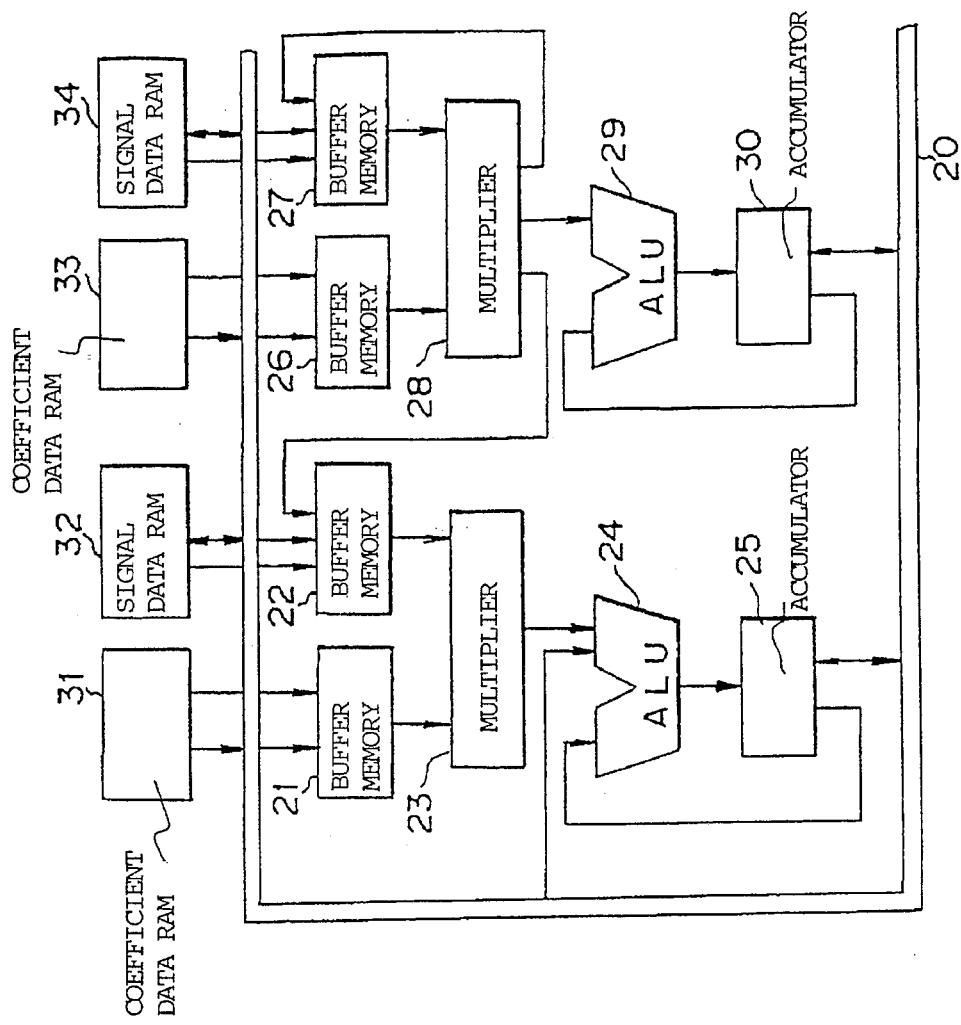
FIG. 4 is a block diagram showing a construction of a DSP to realize a non-linear converting circuit in the harmonic tone generator in FIG. 3.

The non-linear converting circuit 13 is constituted by a DSP (digital signal processor). FIG. 4 shows a schematic construction of the DSP. The DSP is provided with two calculating sections, of which the first calculating section comprises buffer memories 21 and 22, a multiplier 23, an ALU 24, and an accumulator 25. Outputs of the buffer memories 21 and 22 are connected to the multiplier 23, respectively. An output of the multiplier 23 is connected to an input of the ALU 24. An output of the ALU 24 is connected to the accumulator 25. The accumulator 25 has two outputs, one of which is connected one input of the ALU 24 and the other output is connected to a bus 20. The buffer memory 21 has two inputs, one of which is connected to a coefficient data RAM 31 and the other input is connected to the bus 20. The buffer memory 22 has three inputs. The first input among the three inputs is connected to a signal data RAM 32 and the second input is connected to the bus 20.

The second calculating section comprises buffer memories 26 and 27, a multiplier 28, an ALU 29, and an accumulator 30 and is constructed in a manner similar to the first calculating section. One input of the buffer memory 26 is connected to a coefficient data RAM 33 and the other input is connected to the bus 20. The first input of the buffer memory 27 is connected to a signal data RAM 34 and the second input is connected to a signal data RAM 34 and the second input is connected to the bus 20. However, the multiplier 28 of the second calculating section has three outputs, of which the first output is connected to one input of the ALU 29, the second output is connected to the remaining third input of the buffer memory 22, and the third output is connected to the third input of the buffer memory 27.

The coefficient data RAMs 31 and 34 are also connected to the bus 20. The other input of the ALU 24 has two inputs. The first input of the two inputs is connected to the output of the multiplier 23 and the second input is connected to the bus 20.

As for the three inputs of the buffer memory 22, the two inputs of the other buffer memories, the three outputs of the multiplier 28, the two outputs of each of the accumulators 25 and 30, the two outputs of each of the signal data RAMs 32 and 34, and the other two inputs of the ALU 24, only one of them or two or more of them are selectively made effective. The above input/output construction is accomplished by, for instance, a switching circuit comprising a plurality of tri-state buffers or the like.

The operations such as reading operations of the coefficient data from the RAMs 31 and 33, reading operations of the signal data from the RAMs 32 and 34, arithmetic operations of the ALUs 24 and 29, output selecting operations of the data held in the accumulators 25 and 30, output selecting operation of the multiplier 28, and the like are controlled by a sequence controller (not shown) in the DSP. The sequence controller operates in accordance with a program written in a program memory (not shown) in the DSP.

In the DSP with the above construction, before the start of the calculating operation, coefficient data values $c_0, c_1, c_2, \ldots, c_n$ are written into the coefficient data RAM 31. The coefficient data are sequentially read out of the RAM 31 every step in accordance with the order of $c_1, c_2, \ldots, c_n$, and $c_0$. Also signal data x supplied from the LPF 12 is written into the signal data RAM 32 through the bus 20.

When the calculating operation is started, in the first step, the signal data x is first read out of the signal data RAM 34 and supplied to the buffer memories 22, 26, and 27. On the other hand, the coefficient data $c_1$ is read out of the coefficient data RAM 31 and supplied to the buffer memory 21. The multiplier 23, therefore, multiplies the values of the signal data x and coefficient data $c_1$. The value $c_1 x$ as a result of the multiplication by the multiplier 23 is supplied and held into the accumulator 25 through the ALU 24 in the second step which is one step after the first step. The multiplier 28 brings the signal data x to square. The value $x^2$ as a result of the multiplication by the multiplier 28 is supplied to the buffer memories 22 and 27 in the second step.

In the second step, the coefficient data $c_2$ is read out of the coefficient data RAM 31 and supplied to the buffer memory 21. The multiplier 23, therefore, multiplies $x^2$ and the coefficient data value $c_2$. The value $c_2 x^2$ as a result of the multiplication by the multiplier 23 is supplied to the other first input of the ALU 24. Synchronously with the supply of the value $c_2 x^2$, the data value $c_1 x$ held in the accumulator 25 is supplied to one input of the ALU 24. In the third step, therefore, the ALU 24 executes the accumulation of $c_1 x + c_2 x^2$. The value as a result of the accumulation is held in the accumulator 25. The multiplier 28 multiplies the signal data x held in the buffer memory 26 and the signal data $x^2$ held in the buffer memory 27. The value $x^3$ as a result of the multiplication by the multiplier 28 is supplied to the buffer memories 22 and 27 in the third step.

In the third step, the coefficient data $c_3$ is read out of the RAM 31 and supplied to the buffer memory 21. The multiplier 23, therefore, multiplies $x^3$ and the coefficient data value $c_3$. The value $c_3 x^3$ as a result of the multiplication by the multiplier 23 is supplied to the other first input of the ALU 24. Synchronously with the supply of the value $c_3x^3$, the accumulation data value $c_1x+c_2x^2$ held in the accumulator 25 is supplied to one input of the ALU 24. In the fourth step, therefore, the ALU 24 executes the accumulation of $c_1x+c_2x^2+c_3x^3$. The value as a result of the accumulation is held in the accumulator 25. The multiplier 28 multiplies the signal data x held in the buffer memory 26 to the signal data $x^3$ held in the buffer memory 27. The value $x^4$ as a result of the multiplication by the multiplier 28 is supplied to the buffer memories 22 and 27 in the fourth step.

By repeating the above operations, the calculation values are accumulated by the following equation (1).

$$\sum_{n=1}^{n} c_n x^n \quad (1)$$

In the step after the value as a result of the accumulation was held in the accumulator 25, the coefficient data $c_0$ is read out of the coefficient data RAM 31 and supplied to the other second input of the accumulator. Synchronously with the supply of $c_0$, the accumulation data value held in the accumulator 25 is supplied to one input of the ALU 24. The ALU 24, therefore, accumulates the calculation values by the following equation (2).

$$\sum_{n=1}^{n} c_n x^n + c_0 \quad (2)$$

Figure 5:
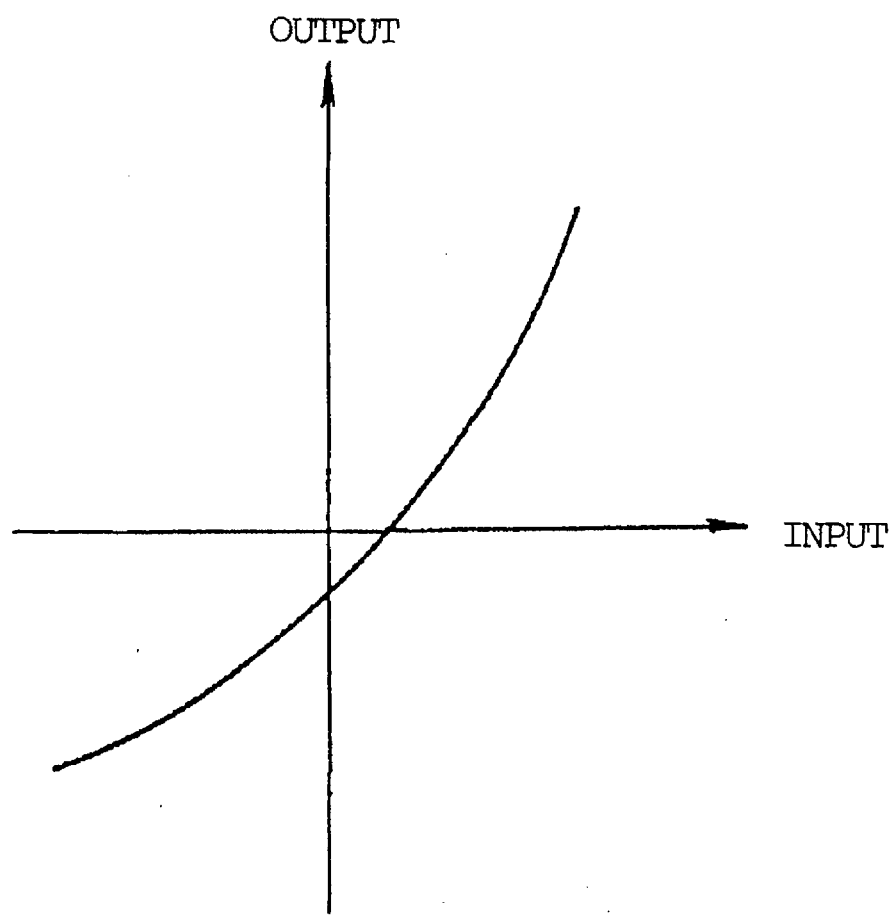
FIG. 5 is a diagram showing input/output characteristics of a non-linear converting circuit.

The value as a result of the accumulation is held in the accumulator 25. For instance, assuming that n=3, the coefficient data are as follows. $c_0=-\frac{1}{4}$, $c_1=\frac{3}{4}$, $c_2=\frac{1}{4}$, and $c_3=\frac{1}{4}$. In the case of such coefficient data, the input/output characteristics of the non-linear converting circuit 13 are as shown in FIG. 5.

Since the input audio signal is non-linearly converted by the non-linear converting circuit 13 as mentioned above, a harmonics signal of the input audio signal is produced. The harmonics signal is supplied to the D/A converter 15 through the HPF 14 and is converted into the analog signal and, thereafter, it is outputted from the output terminal OUT.

The LPF 12 is inserted so as not to cause an aliasing, which will be explained hereinafter, by the harmonics signal which is produced by the non-linear converting circuit 13. The digital data is subjected to the sampling theorem such that the highest frequency included in the signal needs to be equal to or lower than ½ of a sampling frequency $f_s$ so as not to cause a dropout of the information by the sampling. This means that the digital signal cannot express any frequency which is equal to or higher than $f_s/2$. A phenomenon such that the frequency components which are equal to or higher than $f_s/2$ exert an influence on the frequency components which are equal to or lower than $f_s/2$ occurs. Aliasing denotes a phenomenon such that the components which are equal to or higher than $f_s/2$ are folded over the components which are equal to or lower than $f_s/2$. For instance, in a harmonic tone generator producing a second harmonic, if $f_s$=48 kHz, then $f_s/2$=24 kHz. When the components which are equal to or higher than 12 kHz are included in the input signal, the components which are equal to or higher than 24 kHz are produced by the harmonic tone generator, so that the aliasing occurs. To prevent the aliasing, the band is limited by the LPF 12. Since there is a possibility such that a DC component is generated by the non-linear conversion, the HPF 14 is inserted to eliminate the DC component.

Figure 6:
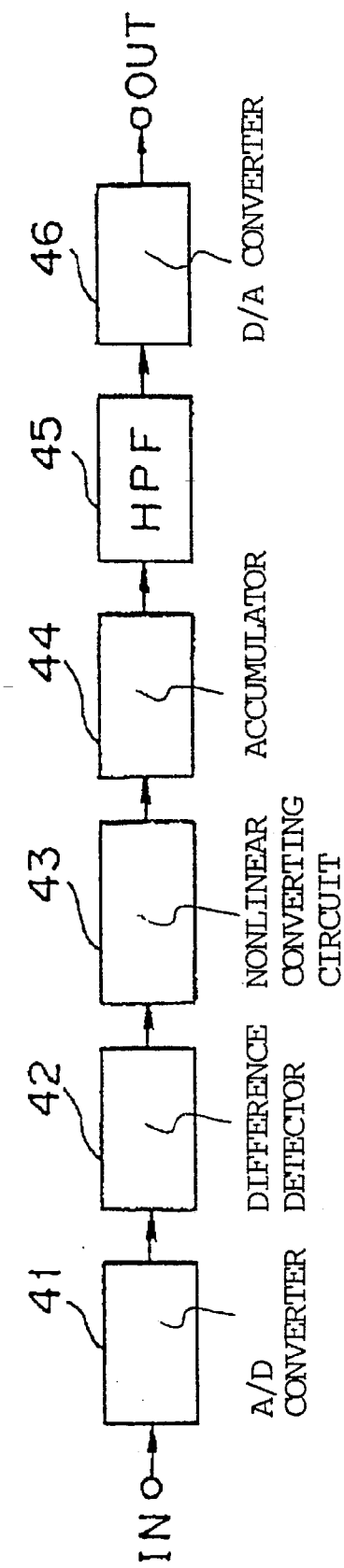
FIG. 6 is a block diagram showing an embodiment according to the second aspect of the invention.

FIG. 6 shows a construction according to the second aspect of the invention. In the harmonic tone generator, a difference detector 42 is connected through an A/D converter 41 to an input terminal IN to which an analog audio signal is supplied. The A/D converter 41 is constructed in a manner similar to the A/D converter 11. The difference detector 42 detects a difference x'(n) between the present audio signal data x(n) which is supplied from the A/D converter 41 and the preceding audio signal data x(n−1). A non-linear converting circuit 43 is connected to an output of the difference detector 42. The non-linear converting circuit 43 has a function f(x'(n)) such that it is non-linear in a region between the input signal and the output signal in a manner similar to the non-linear converting circuit 13. The non-linear converting circuit 43 generates a harmonics signal by using the function f(x'(n)). An accumulator 44 is connected to an output of the non-linear converting circuit 43. The accumulator 44 accumulates a value shown by an output signal of the non-linear converting circuit 43. A D/A converter 46 is connected to an output of the accumulator 44 through an HPF 45. The difference detector 42 comprises: a memory to hold the preceding audio signal data x(n−1); and a subtracter to subtract the preceding audio signal data x(n−1) held in the memory from the present audio signal data x(n) which is supplied from the A/D converter 41. The detector 42 operates synchronously with the sampling timing.

The non-linear converting circuit 43 is constructed by the DSP shown in FIG. 4. In the DSP, the operation as a non-linear converting circuit 43 is similar to that in the case of the non-linear converting circuit 13 mentioned above. The non-linear function which the non-linear converting circuit 43 has is not limited to $f(x)=c_0+c_1x+c_2x^2+\ldots$ but the following function can be also used.

$$f(x)=c_1x+c_3x^3$$

Figure 7:
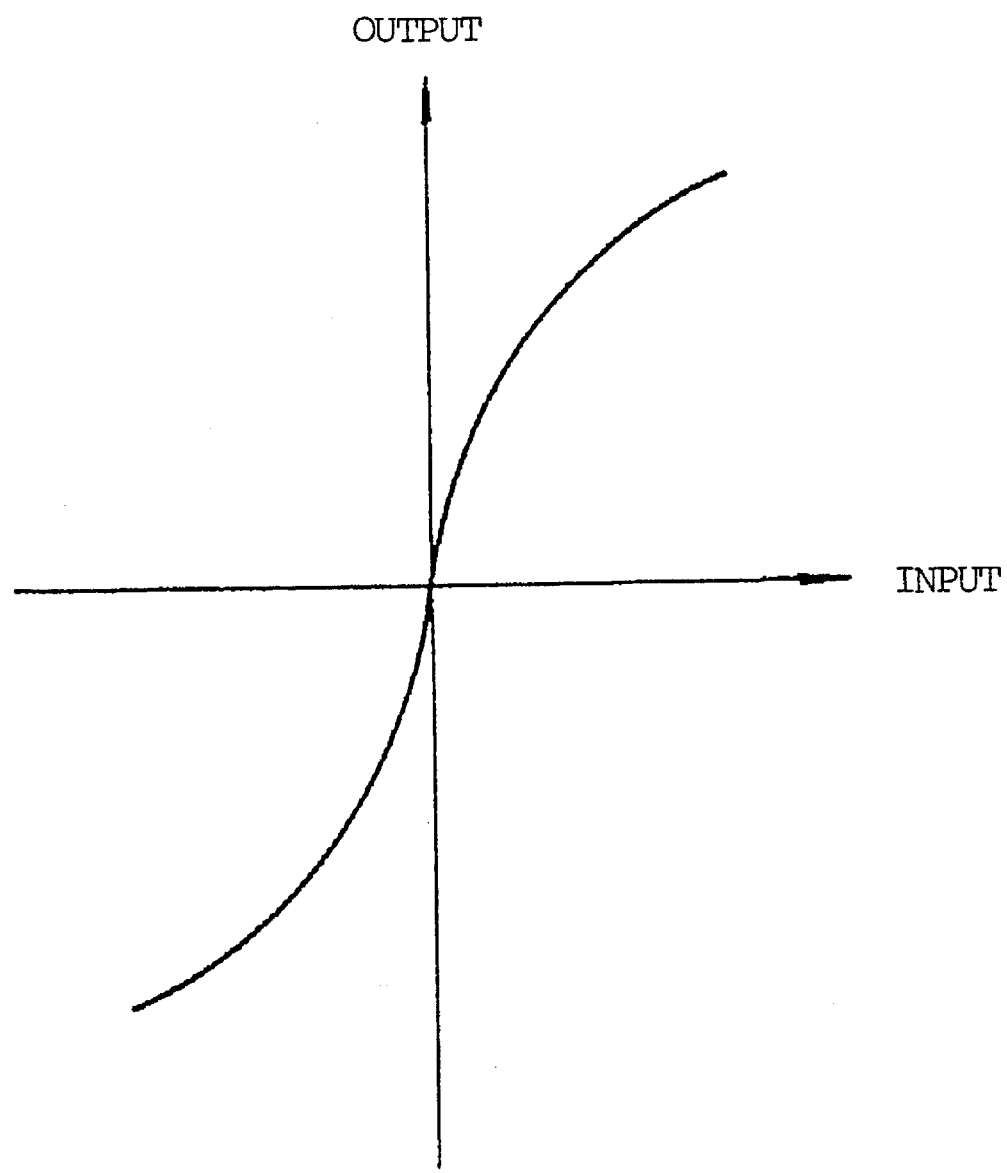
FIG. 7 is a diagram showing input/output characteristics of a non-linear converting circuit in the harmonic tone generator in FIG. 4.

The coefficient data in this function $f(x)=c_1x+c_3x^3$ is, for example, $1-c_1=c_3$ (where, $c_1<0$). With such coefficient data, input/output characteristics of the non-linear converting circuit 43 are as shown in FIG. 7.

When the data indicative of the difference x'(n) between the present audio signal data x(n) and the preceding audio signal data x(n−1) is supplied from the difference detector 42 to the non-linear converting circuit 43, it is converted into the data indicative of f(x'(n)) by the non-linear converting circuit 43. Since the difference x'(n) is non-linearly converted by the non-linear converting circuit 43, a harmonics signal is produced. Assuming that the output signal of the non-linear converting circuit 43 is f(x'(i)), f(x'(i)) is accumulated in a range from i=−∞ to i=n by the accumulator 44. The value y'(n) shown by an output signal of the accumulator 44 is obtained by the following equation (3).

$$y'(n) = \sum_{i=-\infty}^{n} f(x'(i)) \quad (3)$$

After DC components have been eliminated from y'(n) by the HPF 45, the value y'(n) is supplied to the D/A converter 46 and is converted into the analog signal.

The difference detector 42 and the accumulator 44 can be also constructed by the DSP shown in FIG. 4 together with the non-linear converting circuit 43. In the DSP, the operation as a difference detector 42 is executed in a manner such that, for instance, the present audio signal data x(n) is read out of the signal data RAM 34 and supplied to the other input of the ALU 24. On the other hand, the preceding audio signal data x(n−1) held in the accumulator 25 is supplied to one input of the ALU 24. The ALU 24 executes the subtracting operation in accordance with a command signal from the sequence controller and calculates x(n)−x(n−1). The data indicative of the value as a result of the subtraction is held in the signal data RAM 32. The present audio signal data x(n) is held in the accumulator 25 for the next subtracting operation.

Figure 8:
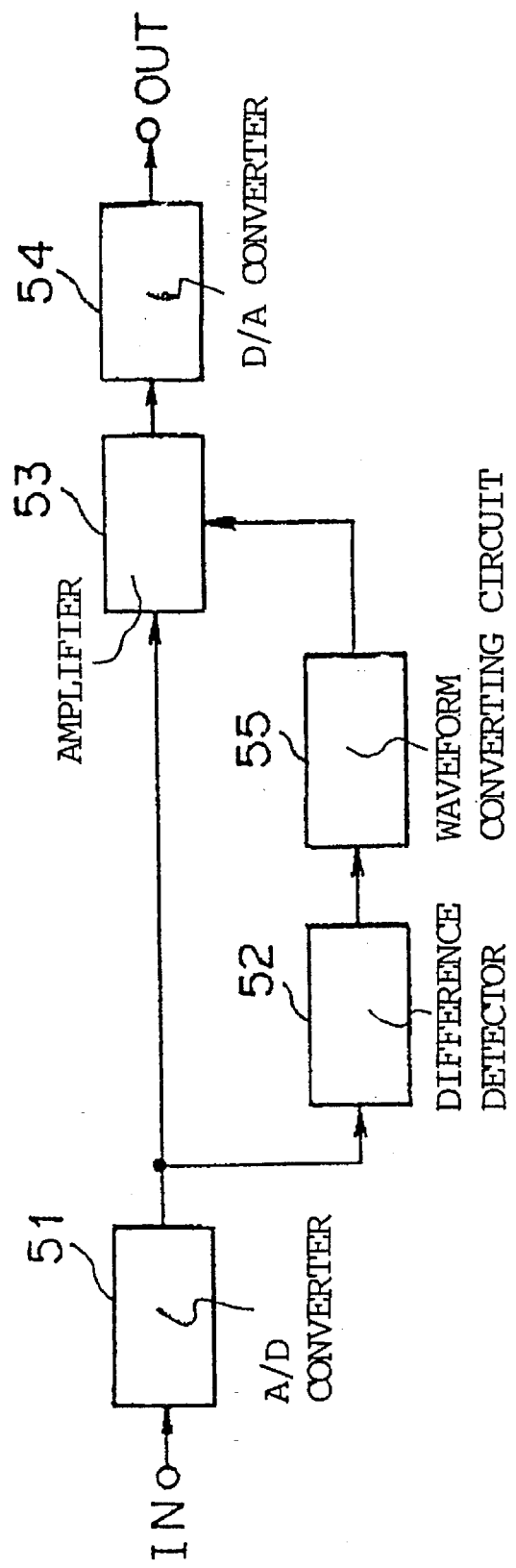
FIG. 8 is a block diagram showing an embodiment according to the third aspect of the invention.

FIG. 8 shows a construction according to the third aspect of the invention. In the harmonic tone generator, a difference detector 52 and an amplifier 53 are connected through an A/D converter 51 to an input terminal IN to which an analog audio signal is supplied. The difference detector 52 is constructed in a manner similar to the difference detector 42 shown in FIG. 6. The amplifier 53 is a digital amplifier whose amplification gain changes in accordance with a control signal. An output terminal OUT is connected to an output of the amplifier 53 through a D/A converter 54. A waveform converting circuit 55 is connected to an output of the difference detector 52. The waveform converting circuit 55 may have a non-linear function such that it is non-linear in a range between the input and output signals in a manner similar to the non-linear converting circuit 13 or may be constructed by a linear converting circuit having a linear function. An output signal of the waveform converting circuit 55 is used as a control signal of the amplifier 53.

Figure 9:
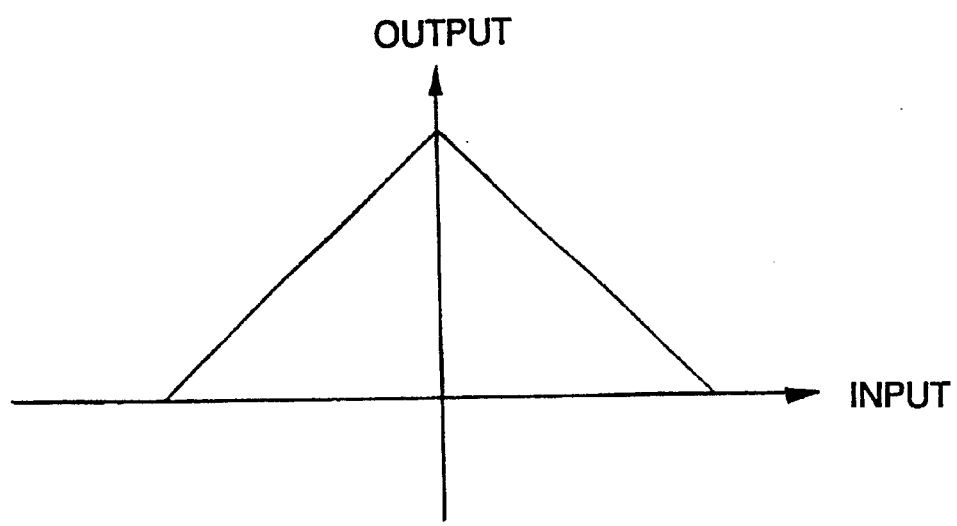
FIG. 9 is a diagram showing input/output characteristics of a waveform converting circuit in the harmonic tone generator in FIG. 6.
Figure 10:
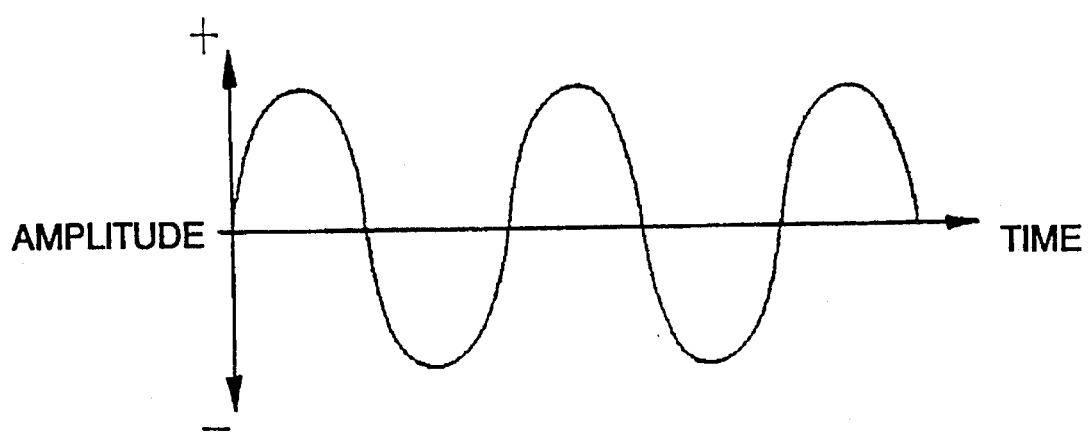
FIG. 10 is a diagram showing an example of an input audio signal waveform.
Figure 11:
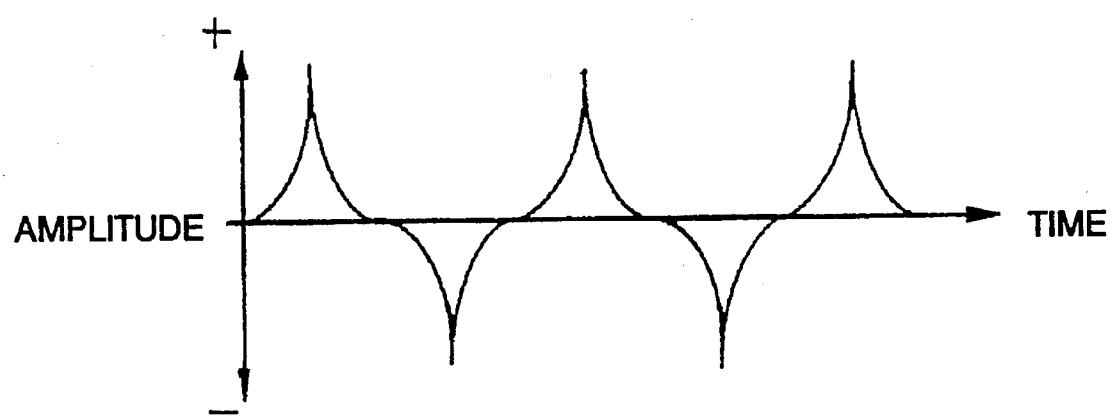
FIG. 11 is a diagram showing an example of an output audio signal waveform.

In the above construction, for instance, the waveform converting circuit 55 converts output data from the difference detector 52 by input/output characteristics as shown in FIG. 9. In the case of the input/output characteristics of FIG. 9, the amplification gain of the amplifier 53 is controlled so as to decrease as a difference x'(n) between the present audio signal data x(n) and the preceding audio signal data x(n−1) is large. When the input audio signal is a sinusoidal wave signal as shown in FIG. 10, the gain of the amplifier 53 changes in accordance with the control signal which is supplied from the waveform converting circuit 55. The signal waveform which is shown by the data which is generated from the amplifier 53 becomes a waveform in which concave and convex portions are emphasized as shown in FIG. 11.

In the harmonic tone generator according to the first aspect of the invention, since the digital audio signal is converted in accordance with a predetermined non-linear function, even an audio signal of a small amplitude is converted in accordance with the predetermined non-linear function. A harmonics signal is consequently produced.

In the harmonic tone generator according to the second aspect of the invention, a level difference between the digital audio signal level in the present sampling and the audio signal level in the preceding sampling is detected, the detected level difference is converted in accordance with a predetermined non-linear function by the non-linear converting means, and the converted output value is accumulated, so that a harmonics signal can be produced even for an audio signal of a small amplitude.

In the harmonic tone generator according to the third aspect of the invention, a level difference between the digital audio signal level at the present sampling time point and the audio signal level at the preceding sampling time point is detected. The detected level difference is converted in accordance with a predetermined function by non-linear converting means. A gain of amplifying means for amplifying the audio signal at the present sampling time point is changed in accordance with a function converted output. A harmonics signal, therefore, can be produced even for an audio signal of a small amplitude.

While the present invention has been described by way of the embodiments shown in FIG. 3, 6 and 8 in which an A/D converter is used for converting an analog input signal to a digital signal, the present invention can also be embodied as an arrangement directly receiving a digital signal. For instance, in the circuit shown in FIG. 3, an input terminal for receiving an input digital signal may be directly connected to the LPF 12. Similarly, in the circuit shown in FIG. 6, an input terminal for receiving an input digital signal may be directly connected to the difference detector 42. Furthermore, in the circuit shown in FIG. 8, an input terminal for receiving an input digital signal may be directly connected to the difference detector 52 and amplifier 53.

What is claimed is:

1. A harmonic tone generator comprising:

A/D converting means for converting an input analog audio signal into a digital audio signal indicative of an audio signal level;

non-linear converting means for converting said digital audio signal supplied from said A/D converting means into an output digital signal in accordance with a predetermined non-linear function, said output digital signal including harmonic tone components not included in said input signal but included in said fundamental tone, said output signal having the same frequency as the fundamental tone of said input signal;

D/A converting means for converting said output digital signal of said non-linear converting means into an analog signal; and a low pass filter interposed between said A/D converting means and said non-linear converting means.

2. A generator according to claim 1, further comprising a high pass filter interposed between said non-linear converting means and said D/A converting means.

3. A harmonic tone generator comprising:

A/D converting means for converting an input analog audio signal into a digital signal indicative of an audio signal level;

difference detecting means for detecting a level difference between said audio signal level supplied from said A/D converting means at a present time point and an audio signal level supplied from said A/D converting means at a preceding time point;

non-linear converting means for converting said level difference detected by said difference detecting means into an output value in accordance with a predetermined non-linear function, said output value including harmonic tone components not included in said input signal said input signal but included in said fundamental tone, said output signal having the same frequency as the fundamental tone of said input signal;

accumulating means for accumulating said output value of said non-linear converting means; and D/A converting means for converting an output digital signal indicative of a result of accumulation by said accumulating means into an analog signal.

4. A harmonic tone generator comprising:

A/D converting means for converting an input analog audio signal into a digital signal indicative of an audio signal level;

difference detecting means for detecting a level difference between said audio signal level supplied from said A/D converting means at a present time point and an audio signal level supplied from said A/D converting means at a preceding time point;

converting means for converting said level difference detected by said difference detecting means into a converted output in accordance with a predetermined function, said converted output including harmonic tone components not included in said input signal;

amplifying means for amplifying said audio signal at the present time point which is generated from said A/D converting means by a gain, said gain varying in accordance with said converted output of said converting means; and D/A converting means for converting an output digital signal of said amplifying means into an analog signal.

5. A harmonic tone generator comprising:

means for receiving a digital audio signal indicative of an audio signal level;

non-linear converting means for converting said digital audio signal supplied from receiving means into an output digital signal in accordance with a predetermined non-linear function, said output digital signal including harmonic tone components not included in said input signal;

D/A converting means for converting said output digital signal of said non-linear converting means into an analog signal; and a low pass filter interposed between said receiving means and said non-linear converting means.

6. A generator according to claim 5, further comprising a high pass filter interposed between said non-linear converting means and said D/A converting means.

7. A harmonic tone generator comprising:

means for receiving a digital signal indicative of an audio signal level;

difference detecting means for detecting a level difference between said audio signal level supplied from said receiving means at a present time point and an audio signal level supplied from said receiving means at a preceding time point;

non-linear converting means for converting said level difference detected by said difference detecting means into an output value in accordance with a predetermined non-linear function, said output value including harmonic tone components not included in said input signal;

accumulating means for accumulating said output value of said non-linear converting means; and D/A converting means for converting an output digital signal indicative of a result of accumulation by said accumulating means into an analog signal.

8. A harmonic tone generator comprising:

receiving means for receiving a digital signal indicative of an audio signal level;

difference detecting means for detecting a level difference between said audio signal level supplied from said receiving means at a present time point and an audio signal level supplied from said receiving means at a preceding time point;

converting means for converting said level difference detected by said difference detecting means into a converted output in accordance with a predetermined function, said converted output including harmonic tone components not included in said input signal;

amplifying means for amplifying said audio signal at the present time point which is supplied from said receiving means by a gain, said gain varying in accordance with said converted output of said converting means; and D/A converting means for converting an output digital signal of said amplifying means into an analog signal.

* * * * *